(12) United States Patent
Suzuki

(10) Patent No.: US 6,494,957 B1
(45) Date of Patent: Dec. 17, 2002

(54) VAPORIZING APPARATUS

(75) Inventor: Isao Suzuki, Tokyo (JP)

(73) Assignee: MKS Japan, Inc., Tokyo (JP)

( * ) Notice: Subject to any disclaimer, the term of this patent is extended or adjusted under 35 U.S.C. 154(b) by 241 days.

(21) Appl. No.: 09/594,790

(22) Filed: Jun. 16, 2000

(30) Foreign Application Priority Data

Jun. 18, 1999 (JP) ................................. 11-172855

(51) Int. Cl.[7] ........................ C23C 16/00; C23C 16/448
(52) U.S. Cl. ...................... 118/726; 392/386; 392/394; 261/142
(58) Field of Search .................. 118/726; 392/386, 392/388, 394, 400, 401; 261/141, 142; 62/50.2, 50.7

(56) References Cited

U.S. PATENT DOCUMENTS

| | | | | |
|---|---|---|---|---|
| 414,207 A | * | 11/1889 | Gillet | 122/155.2 |
| 1,344,303 A | * | 6/1920 | Little | 219/206 |
| 4,275,699 A | * | 6/1981 | Troglin | 123/549 |
| 5,078,976 A | * | 1/1992 | Shibauchi et al. | 122/491 |
| 5,371,828 A | * | 12/1994 | Ewing | 122/40 |
| 5,520,001 A | * | 5/1996 | Miyamoto et al. | 62/50.2 |
| 5,553,188 A | * | 9/1996 | Ewing | 122/40 |
| 5,595,603 A | * | 1/1997 | Klinedinst et al. | 118/715 |
| 6,169,852 B1 | * | 1/2001 | Liao et al. | 261/142 |
| 6,176,930 B1 | * | 1/2001 | Koai et al. | 118/715 |
| 6,346,478 B1 | * | 2/2002 | Pyo et al. | 438/681 |

* cited by examiner

Primary Examiner—Jeffrie R. Lund
(74) Attorney, Agent, or Firm—Wenderoth, Lind & Ponack, L.L.P.

(57) ABSTRACT

The vaporizing apparatus comprises a disk portion in which a plurality of sheet disks are provided in a stacked configuration, with a top disk being provided on a top of the sheet disks. Each of the sheet disks has a thin sheetlike form and includes a through-hole at a central portion thereof. A shaft extends through these openings and supports the sheet disks and the top disk. The disk portion is accommodated in a chamber formed on a base. A liquid is introduced through a flow passage into the openings of the sheet disks of the disk portion in the chamber. Heaters are provided within the base. A piezoactuator is provided so as to bias the disk portion in the chamber from a side of the top disk. The piezoactuator adjusts the gaps between the disks and opening/closing of the flow passage.

17 Claims, 6 Drawing Sheets

VAPORIZING APPARATUS

BACKGROUND OF THE INVENTION

The present invention relates to a vaporizing apparatus for use in, for example, producing semiconductors. More specifically, the present invention relates to a vaporizing apparatus which is used to convert a liquid into a vapor and introduce the vapor into a processing chamber.

In recent years, in producing semiconductors, there has been an increasing demand for an apparatus for heating and vaporizing a liquid material, such as TEOS (tetraethoxysilane), a copper (I) compound or DMAH (dimethyl aluminum hydride), and stably supplying the vaporized material to a processing chamber. To control the supply of the material, a liquid pump and a liquid flowmeter are used. For example, a liquid material is controlled by a liquid flowmeter so as to flow at a predetermined flow rate, vaporized in a vaporizing apparatus and supplied to a processing chamber.

As an example of the vaporizing apparatus, there can be mentioned a vaporizing apparatus described in U.S. Pat. No. 5,553,188. In this vaporizing apparatus, a plurality of disks are provided in a stacked configuration, and a liquid is forced into and vaporized in the gaps between the disks. This vaporizing apparatus is small in size and enables vaporization with a satisfactorily high efficiency. However, the disks are pressed with a large force in order to achieve a high efficiency of vaporization, so that the vaporizing apparatus must be used in combination with a liquid pump capable of generating a high pressure. Consequently, the system is large and costly. Further, when the supply of a material is stopped, material remaining between the disks is subject to a change in properties, leading to clogging between the disks.

On the other hand, U.S. Pat. No. 5,520,001 discloses a vaporizing apparatus wherein a liquid material is vaporized in a small gap which is formed by a control valve body having a variable degree of opening, so as to control a rate of vaporization of the liquid material. However, a surface area for contact with the liquid in the above-mentioned gap is limited, with the result that vaporization efficiency is low.

SUMMARY OF THE INVENTION

In view of the above, the present invention has been made. It is an object of the present invention to provide a vaporizing apparatus which is small in size and enables vaporization of a liquid material with a satisfactorily high efficiency, and which limits the amount of material remaining after a vaporization operation.

According to the present invention, there is provided a vaporizing apparatus comprising:
  a supply opening for supplying a liquid material;
  a disk provided for covering the supply opening;
  a discharge opening for discharging a vapor obtained by vaporizing the liquid material; and
  an actuator for arbitrarily controlling a gap between the disk and the supply opening in accordance with a desired rate of vaporization.

By this arrangement, the gap between the disk and the supply opening can be arbitrarily controlled by the actuator, so that the rate of vaporization of the liquid material can be appropriately controlled.

The foregoing and other objects, features and advantages of the present invention will become apparent from the following detailed description and appended claims read in conjunction with the accompanying drawings.

DETAILED DESCRIPTION OF THE INVENTION

Figure 1:
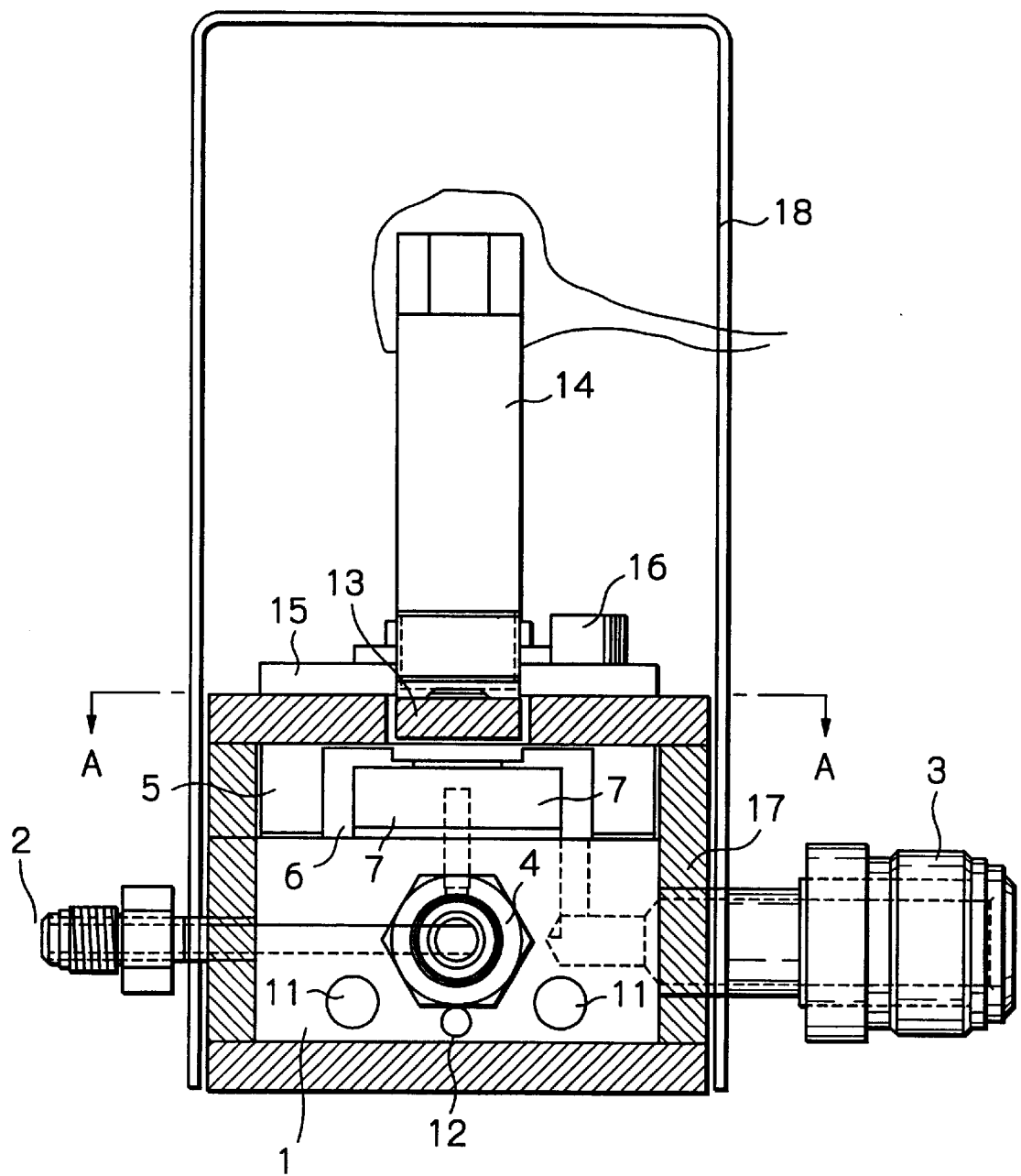
FIG. 1 shows an arrangement of a vaporizing apparatus according to a first embodiment of the present invention.
Figure 2:
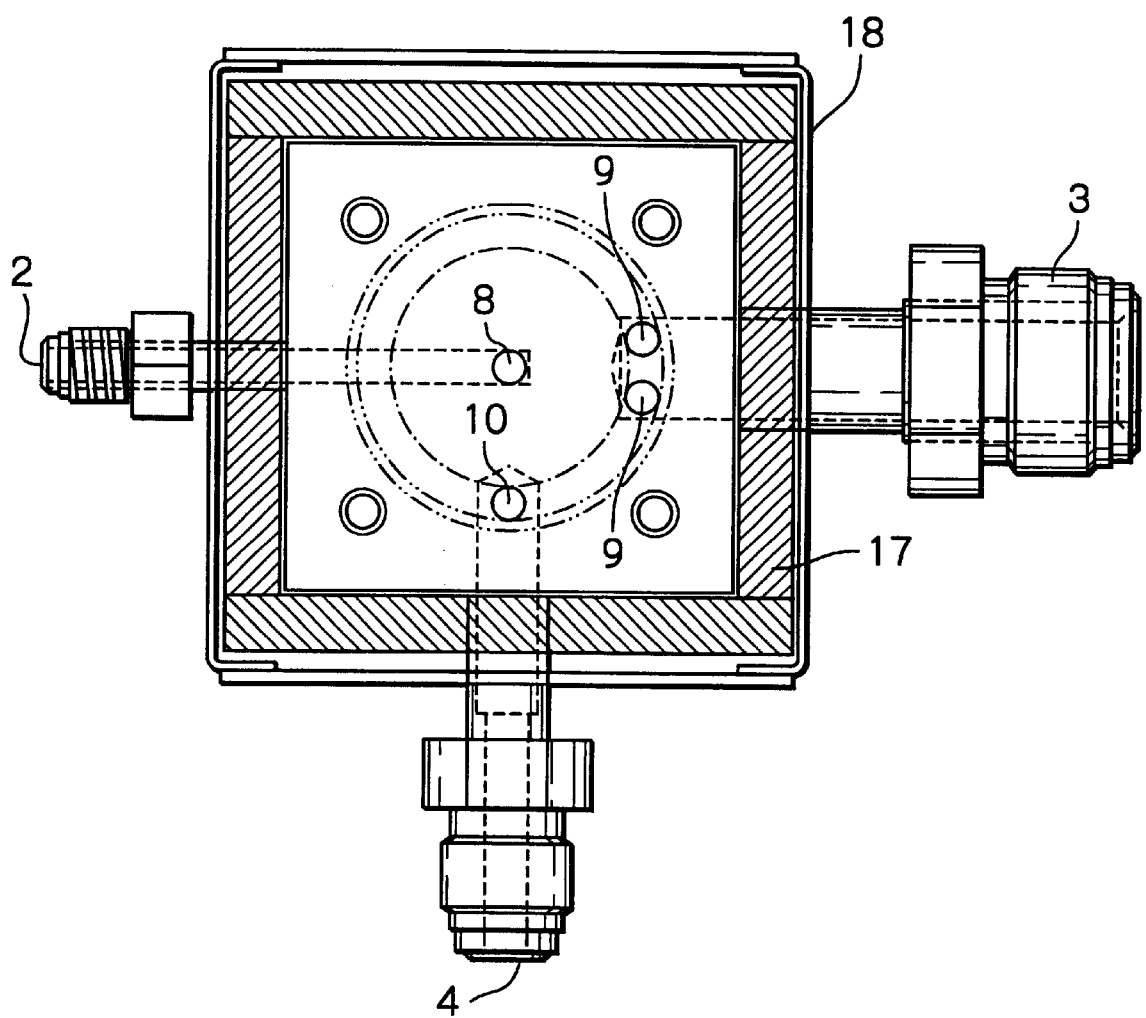
FIG. 2 is a cross-sectional view, taken along the line A—A in FIG. 1.

Hereinbelow, embodiments of the present invention are described, referring to the drawings. In the drawings, the same elements are designated by the same reference numerals, with overlapping explanation thereof being omitted. FIGS. 1 and 2 show a vaporizing apparatus according to a first embodiment of the present invention. A rectangular parallelepiped-shaped base 1 is connected to an inlet opening 2 for a liquid material, an outlet opening 3 for a vaporized material and a vent port 4 for mixing the vaporized material with other gases or temporarily discharging the vaporized material.

A flow passage extending from the inlet opening 2 is formed within the base 1. This flow passage is subject to a change in direction at a central portion of the base 1, extends upward and opens at a central portion of an upper surface of the base 1. A disk case 5 is provided above the upper surface of the base 1 so as to form a chamber 6, with a space between the disk case 5 and the base 1 outside the chamber 6 being sealed with an O-ring. A disk portion 7 is provided in the chamber 6 so as to cover an opening 8 of the flow passage extending from the inlet opening 2. On the upper surface of the base 1 within the chamber 6 at a position outside the disk portion 7, openings 9 for discharging the vaporized material to the outlet opening 3 and an opening 10 for discharging the vaporized material to the vent port 4 are formed. Flow passages extending vertically downward from the openings 9 further extend in a lateral direction to the outlet opening 3. A flow passage extending vertically downward from the opening 10 further extends in a lateral direction to the vent port 4.

Figure 3:
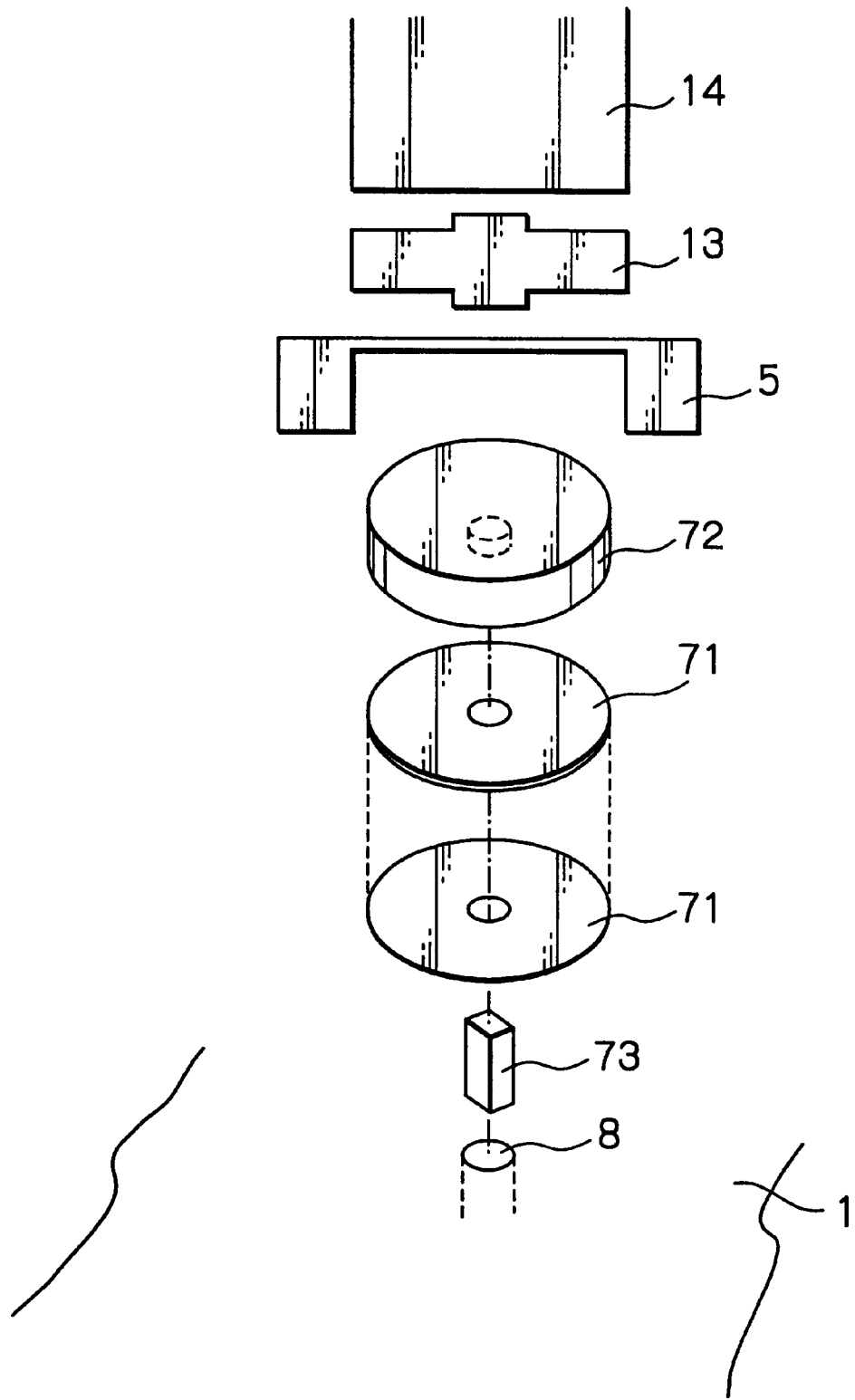
FIG. 3 is a disassembled perspective view of an essential part of the vaporizing apparatus in the first embodiment.

As shown in FIG. 3, the disk portion 7 comprises a plurality of sheet disks 71, each including a through-hole formed at a central portion thereof, and a thick-walled top disk 72 provided on a top of the sheet disks 71. The top disk 72 includes a recess formed therein on a side of the sheet disks 71. A shaft 73 is inserted into the opening 8 of the base 1. The shaft 73 on a side opposite to the opening 8 extends through the through-holes of the sheet disks 71 and is inserted into the recess of the top disk 72 so as to support the disks 71 and 72. The shaft 73 has a form which is obtained by vertically cutting an outer wall surface of a cylindrical member at two positions, so as to permit passage of the liquid. The surface of the base 1 which makes contact with the lowermost sheet disk 71 is made flat to enable sealing contact with the sheet disk 71 without leakage.

Rod-shaped heaters 11 and a temperature sensor 12 are provided within the base 1. The base 1 is heated by providing a current to the heaters 11, and a temperature can be detected through an output from the temperature sensor 12.

An insulating movable block 13 is provided at a central portion of an upper surface of the disk case 5, and a piezoactuator 14 comprising a piezostack is provided above the movable block 13. The piezoactuator 14 is held in vertical position by a holding member 15 and fixed to the base 1 by means of four screws 16. The base 1 is covered with an insulating material 17, thereby suppressing transmission of heat from the heaters 11 to the piezoactuator 14. The base 1 covered with the insulating material 17 and the piezoactuator 14 are covered with a case 18.

In the vaporizing apparatus arranged as mentioned above, the piezoactuator 14 is connected to a controller which receives a flow rate signal from an external flow rate sensor. In order to obtain a predetermined output from the flow rate sensor, the controller supplies a control signal to the piezoactuator 14, which in turn presses the movable block 13 downward, thus controlling the size of the gaps existing between the sheet disks 71 of the disk portion 7 through the disk case 5, so as to vaporize the material at a desired rate and supply the vaporized material to, for example, a processing chamber. It should be noted that the number of sheet disks 71 can be varied, depending on the desired rate of vaporization. The sheet disks 71 may be removed if the liquid is required to be vaporized at a low rate.

The temperature of the base 1 is outputted from the temperature sensor 12. This output of the temperature is supplied to an external temperature controller. The temperature controller provides a current to the heaters 11 so that the temperature of the base 1 coincides with a predetermined vaporizing temperature.

Figure 4:
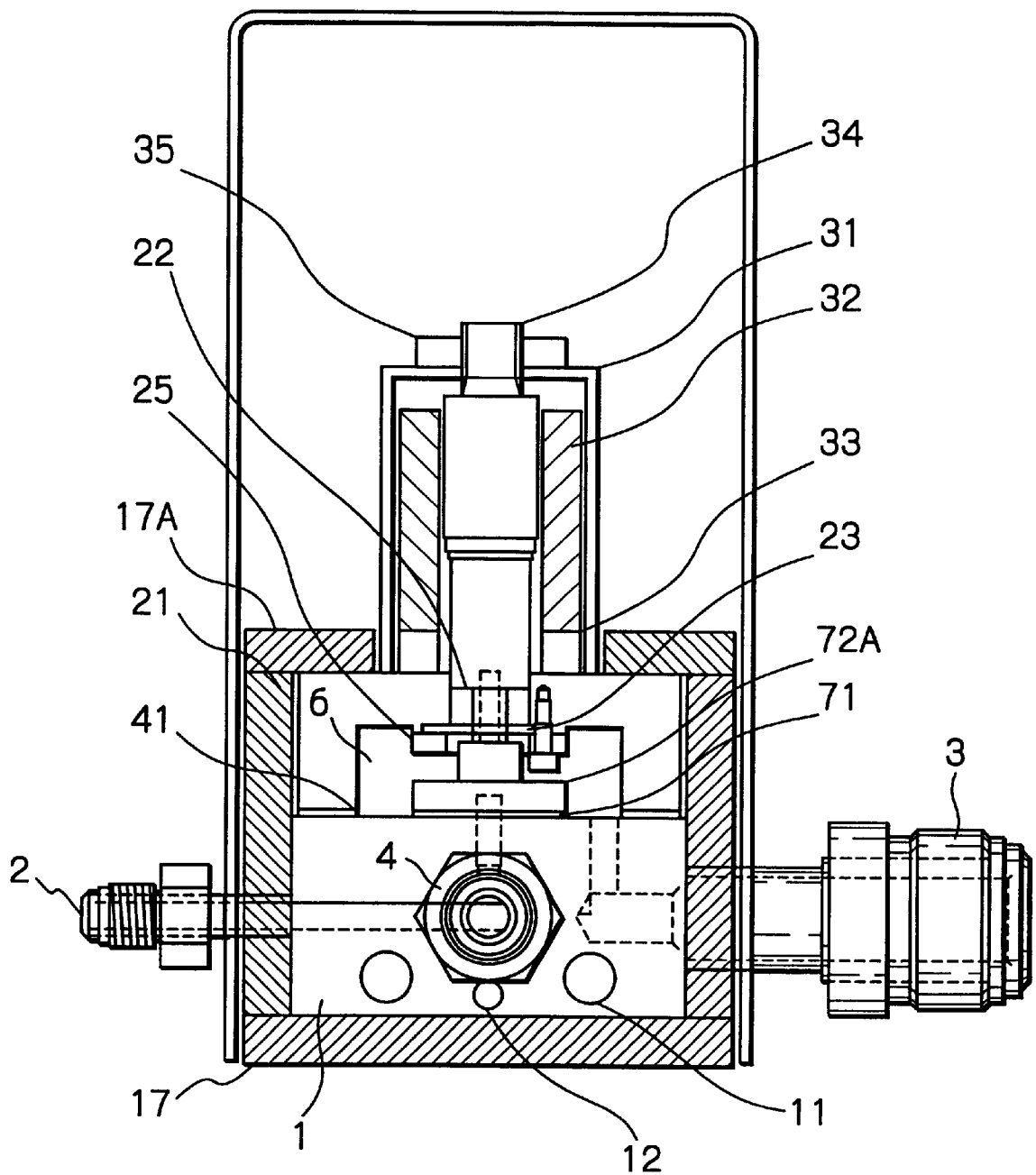
FIG. 4 shows an arrangement of a vaporizing apparatus according to a second embodiment of the present invention.
Figure 5:
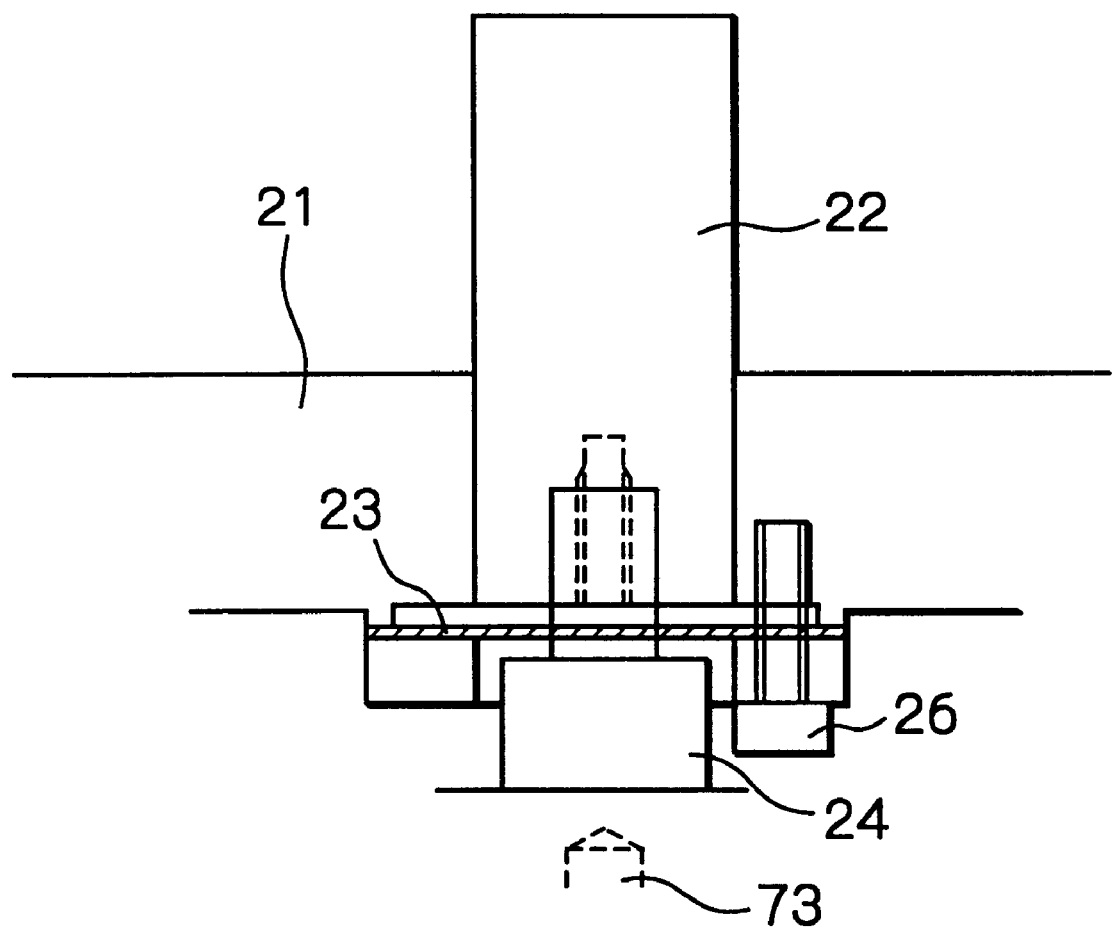
FIG. 5 is an enlarged view of an essential part of the vaporizing apparatus of FIG. 4.
Figure 6:
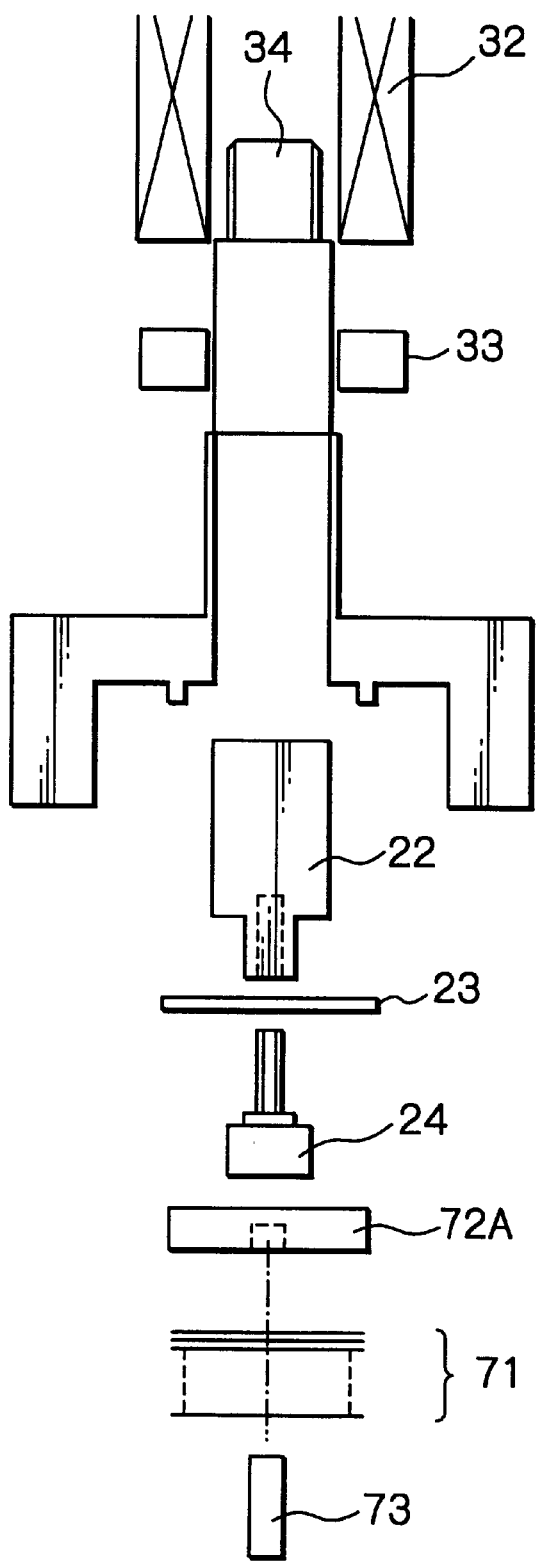
FIG. 6 shows an assembly of the essential part of the vaporizing apparatus of FIG. 4.

FIG. 4 shows a vaporizing apparatus according to a second embodiment of the present invention. FIG. 5 shows an arrangement of an essential part of the vaporizing apparatus of FIG. 4. FIG. 6 shows an assembly of the essential part. In the second embodiment, an electromagnetic solenoid is used as the actuator. The chamber 6 which accommodates the disk portion 7 is formed by a disk case 21 which includes an opening formed at the center of an upper portion thereof. A space between the disk case 21 and the base 1 outside the chamber 6 is sealed with an O-ring 41. A plunger 22 is slidably provided in the opening of the upper portion of the disk case 21. A pressure block 24 is partially embedded in a distal end portion of the plunger 22, with a disk spring 23 being provided between the pressure block 24 and the plunger 22. The disk spring 23 is fixed to the disk case 21 by means of a three-hole ring 25 and bolts 26. A top disk 72A is provided with a recess formed at a central portion thereof on a side of the sheet disks 71. The top disk 72A is biased toward the base 1 through the pressure block 24 under a force generated by the disk spring 23.

An insulating member 17A covers an upper surface of the disk case 21. An opening is formed in a central portion of the insulating member 17A, and a lower portion of a coil case 31 is inserted into this opening. A cylindrical coil 32 is contained in the coil case 31. A metal ring 33 is provided on a lower end of an inner wall surface of the coil case 31.

A cylindrical tube is connected to a central portion of the disk case 21 by means of welding. A yoke 34 is welded to a distal end of the tube. A threaded portion is formed on an outer circumferential surface of a distal end of the yoke 34. The coil case 31 is fixed by engaging a fixing screw 35 with the threaded portion of the yoke 34.

In the vaporizing apparatus in the second embodiment, an actuator of the electromagnetic solenoid is connected to a controller which receives a flow rate signal from an external flow rate sensor. In order to obtain a predetermined output from the flow rate sensor, the controller supplies a control signal to the actuator of the electromagnetic solenoid, which in turn moves the pressure block 24 in an upward direction, thus controlling the size of the gaps between the sheet disks 71.

The temperature of the base 1 is outputted from the temperature sensor 12. This output of the temperature is supplied to an external temperature controller. The temperature controller provides a current to the heaters 11 so that the temperature of the base 1 coincides with a predetermined vaporizing temperature.

In the above-mentioned two embodiments, a liquid material is caused to flow into a gap between the base and a circular disk having a large surface area, so that highly efficient vaporization can be conducted. Further, the number of sheet disks can be determined according to a desired rate of vaporization, so that a vaporizing apparatus which is small in size and which enables extremely highly efficient vaporization can be realized. Further, an insulating material is provided between the base and the actuator, so that the liquid material can be efficiently heated to a desired temperature for vaporization.

In the first embodiment in which the piezoactuator is used, a stress generated by the actuator is extremely large, i.e., 80 kg/cm$^2$. Therefore, when the supply of vaporized material is temporarily stopped, material in the gaps between the disks can be surely expelled by the actuator, so that clogging of the gaps between the disks can be avoided.

In the second embodiment in which the electromagnetic solenoid is used, the stroke of the actuator is 10 times or more that of the piezoactuator. Therefore, the vaporizing apparatus of the second embodiment is suitable for use when the supply pressure of the liquid material is low. Further, because the stroke of the actuator is large, cleaning by purging can be easily conducted.

As has been described above, the vaporizing apparatus of the present invention comprises: a supply opening for supplying a liquid material; a disk provided for covering the supply opening; a discharge opening for discharging a vapor obtained by vaporizing the liquid material; and an actuator for arbitrarily controlling a gap between the disk and the supply opening in accordance with a desired rate of vaporization. By this arrangement, the gap between the disk and the supply opening can be arbitrarily controlled by the actuator, so that the rate of vaporization of the liquid material can be appropriately controlled. When the supply of the material is halted, the gap between the disk and the supply opening can be made extremely small, thereby avoiding clogging of the disks due to material remaining therebetween.

What is claimed is:

1. A vaporizing apparatus comprising:
   a supply opening for supplying a liquid material;
   a disk provided for covering said supply opening;
   a discharge opening for discharging a vapor obtained by vaporizing said liquid material; and
   an actuator for arbitrarily controlling a gap between the disk and the supply opening in accordance with a desired rate of vaporization.

2. A vaporizing apparatus according to claim 1, wherein a plurality of first disks and a second disk are provided as said disk, each of the first disks having a thin sheetlike form, the second disk being adapted to hold the first disks in horizontal position.

3. A vaporizing apparatus according to claim 2, wherein said disk includes an element comprising a through-hole or a recess, and a shaft for holding the disk in position is provided in said supply opening, the shaft being adapted to be inserted into said element.

4. A vaporizing apparatus according to claim 3, wherein said actuator is a piezoelement.

5. A vaporizing apparatus according to claim 3, wherein said actuator comprises and electromagnetic solenoid.

6. A vaporizing apparatus according to claim 2, wherein said actuator is a piezoelement.

7. A vaporizing apparatus according to claim 2, wherein said actuator comprises an electromagnetic solenoid.

8. A vaporizing apparatus according to claim 1, wherein said disk includes an element comprising a through-hole or a recess, and a shaft for holding the disk in position is provided in said supply opening, the shaft being adapted to be inserted into said element.

9. A vaporizing apparatus according to claim 8, wherein said actuator is a piezoelement.

10. A vaporizing apparatus according to claim 8, wherein said actuator comprises an electromagnetic solenoid.

11. A vaporizing apparatus according to claim 1, wherein a surface including the supply opening and a surface of the disk facing said surface including the supply opening are flat.

12. A vaporizing apparatus according to claim 11, wherein said actuator is a piezoelement.

13. A vaporizing apparatus according to claim 11 wherein said actuator comprises an electromagnetic solenoid.

14. A vaporizing apparatus according to claim 1 wherein said actuator is a piezoelement.

15. A vaporizing apparatus according to claim 1, further comprising a disk case for accommodating the disk and an insulating material provided between the actuator and the disk case.

16. A vaporizing apparatus according to claim 1, wherein said actuator comprises an electromagnetic solenoid.

17. A vaporizing apparatus according to claim 6 wherein at least a part of said disk is made of a magnetic material.

* * * * *